United States Patent
Buchwalter et al.

(10) Patent No.: US 7,456,046 B2
(45) Date of Patent: Nov. 25, 2008

(54) METHOD TO CREATE FLEXIBLE CONNECTIONS FOR INTEGRATED CIRCUITS

(75) Inventors: Leena Paivikki Buchwalter, Hopewell Junction, NY (US); Russell A. Budd, North Salem, NY (US); Chirag S. Patel, Peekskill, NY (US)

(73) Assignee: International Business Machines Corporation, Armonk, NY (US)

( * ) Notice: Subject to any disclaimer, the term of this patent is extended or adjusted under 35 U.S.C. 154(b) by 50 days.

(21) Appl. No.: 11/063,449

(22) Filed: Feb. 23, 2005

(65) Prior Publication Data

US 2006/0186540 A1  Aug. 24, 2006

(51) Int. Cl.
*H01L 21/44* (2006.01)
(52) U.S. Cl. .................. 438/107; 438/106; 438/584
(58) Field of Classification Search .......... 438/106, 438/107, 584
See application file for complete search history.

(56) References Cited

U.S. PATENT DOCUMENTS

| | | | |
|---|---|---|---|
| 4,845,542 A | 7/1989 | Bezuk et al. | |
| 6,104,087 A | 8/2000 | DiStefano et al. | |
| 6,211,572 B1 | 4/2001 | Fjelstad et al. | |
| 6,372,527 B1 | 4/2002 | Khandros et al. | |
| 6,521,970 B1 | 2/2003 | Takiar et al. | |
| 6,528,349 B1 | 3/2003 | Patel et al. | |
| 2003/0234037 A1* | 12/2003 | Tanaka | 136/205 |
| 2004/0241909 A1* | 12/2004 | Varlyam | 438/117 |

* cited by examiner

*Primary Examiner*—Long Pham
(74) *Attorney, Agent, or Firm*—Scully, Scott, Murphy & Presser, P.C.; Robert M. Trepp, Esq.

(57) ABSTRACT

A method of producing flexible interconnections for integrated circuits, and, in particular, the forming of flexible or compliant interconnections preferably by a laser-assisted chemical vapor deposition process in semiconductor or glass substrate-based carriers which are employed for mounting and packaging multiple integrated circuit chips and selectively, other devices in the technology.

1 Claim, 6 Drawing Sheets

METHOD TO CREATE FLEXIBLE CONNECTIONS FOR INTEGRATED CIRCUITS

BACKGROUND OF THE INVENTION

1. Field of the Invention

The present invention relates to a novel method of producing flexible interconnections for integrated circuits, and, in particular, although not limited thereto, to the provision of forming flexible or compliant interconnections in semiconductor or glass substrate-based carriers which are employed for mounting and packaging multiple integrated circuit chips and selectively, other devices in the technology. In particular, the integrated circuit chip or the plurality of chips, which are mounted on a carrier, is or are connected to a next level package or a circuit board, and wherein the next level package may be constituted of a ceramic or an organic composite depending upon particular intended applications.

Basically, in the formation of integrated circuits employing organic chip carriers, the provision of a flexible or compliant interconnection assumes great importance in maintaining the operative integrity of the integrated circuits, due to the differences, which are frequently encountered in the mismatches in the thermal coefficients of expansion (CTE), which are present between the organic chip carrier and the chip or chips, or a silicon carrier (Si-carrier), which is bonded thereto.

In essence, when the applicable chip or the Si-carrier is, or chips or carriers, are of a large size or sizes, the mismatch between the respective CTEs is further increased, inasmuch as the flexible interconnection size must be specifically designed to take cognizance of the differences in the absolute physical movement or displacement between the respective components as a function of the displacement or distance which is measured from a so-called neutral point of the overall semiconductor structure.

Generally, the differences or mismatches which may be present in the coefficients of thermal expansions between the components create problems in the fatigue life of the interconnection in response to an increase in the difference or mismatch between the CTEs of the substrate and the chip or chips. In the prior art, and in current state of the technology, cognizance has been given to such differences or CTE mismatches in the x and y-directions or planes of the integrated circuit structure. However, although the movements in the x and y plane to which considerations have been given in improvising solutions in the formation of the compliant or flexible connections between a chip and carrier, and have been extensively treated in the prior art, and have also been addressed in applicants' co-pending U.S. patent application Ser. No. 10/686,640, filed on Oct. 17, 2003, the disclosure of which is incorporated in its entirety herein by reference, that application being commonly assigned to the assignee of the present application.

In order to provide a compliant or essentially flexible interconnection, which will take cognizance of the CTE mismatches which are encountered between the chip or chips and the substrate or carrier components, utilization has been implemented of methods of laser assisted chemical vapor deposition (LCVD) of the conductors which form the electrical interconnections. Thus, for instance, in order to form the interconnections, any metal which is suitable for that purpose can be deposited by means of laser assisted chemical vapor deposition (LCVD), wherein such metal forming the interconnection may be suitably constituted of, but not limited to, tungsten, molybdenum, tantalum and platinum, although tungsten is preferably the most widely employed of these types of metals.

For example, pertaining to the basic concept of chemical vapor deposition (CVD), a solid material is deposited from gaseous reactants through chemical reactions onto or in the vicinity of a heated surface. The resulting properties of the deposited material can be readily controlled by appropriate regulation of the process conditions, and which normally entails a multi-step process in order to form the interconnections. In implementing the LCVD, a laser is employed in order to thermally or photochemically activate the CVD process, whereby laser frequencies are selected such that the gaseous reactants do not absorb the radiation, and a focused laser may be utilized as a localized heat source. The laser may be either a continuous wave laser or, alternatively, a pulsed laser, wherein the use of such LCVD processes, including the thermally activated CVD process, is known in the current state of the technology. The CVD techniques may be employed to deposit various solid materials, such as metals, alloys and non-metals and compounds comprising carbides, nitrides and oxides, whereby deposition of the material may be in the form of thin films, fibers, powders, rods or other three-dimensional structures.

For the purpose of testing integrated circuit chips in wafer, singulated, carrier, or package form, it is important for a probing substrate to have a compliant or flexible probe tip or interconnect, due to non-planarity of surface pads or solder bumps that are present on the surface of the wafer, chip, carrier, or package. Furthermore, it is desirable to have a probe tip surface to be mechanically and chemically durable and physically abrasive such that upon physical contact with the device under test (i.e., wafer, chip, carrier, or package), any existing surface oxides and residues that may have formed on the surface of a pad or a solder bump are effectively removed to assure a low resistance electrical contact during testing.

Heretofore, in the current state of the technology, either no consideration or only a limited degree of consideration has been given to the forming of flexible interconnects in integrated circuit structures which take cognizance of compliance in the z-direction, in addition to compliance in the x and y planes.

For instance, especially in the case of an organic chip carrier, is a matter of extreme importance, that in connection with the use of a flexible interconnection there must be accounted for differences or mismatches in the thermal coefficients of expansion (CTEs) between the interconnection and the chip or the Si-carrier which is bonded thereto.

As indicated in FIG. 7 of the drawings, which sets forth fatigue life-cycles versus coefficients of thermal expansion of the substrate, there is a clear correlation of the interrelationship in the fatigue life-cycle with regard to the differences which are evident between the substrate and chip coefficients of thermal expansion.

Furthermore, the stress and strain, which is created by the interconnection due to the physical dimensions of the chip or carrier and the height of the interconnection, have an important bearing on the provision of a compliant or flexible interconnection in the z-direction. Although ceramic chip carriers attractive from the standpoint of their thermal characteristics, they are expensive to produce and in order to reduce manufacturing costs, extensive considerations are being given to the use of chip carriers, which are constituted of polymeric materials. Nevertheless, the difference in the coefficients of thermal expansion (CTEs) between the chip and the carrier is evident to a degree so as to cause significant problems with regard to the integrity and service life expectancy of standard C4 connections.

2. Discussion of the Prior Art

For example, in effecting formation of a compliant connection between a chip and carrier allowing for movements in the x- and y-plane, which take into consideration compensating for CTE differences or mismatches, prior art publications, such as Patel, et al., U.S. Pat. No. 6,528,349 B1; Takiar, et al., U.S. Pat. No. 6,521,970 B1; Khandros, et al., U.S. Pat. No. 6,372,527 B1; Fjelstad, et al., U.S. Pat. No. 6,211,572 B1; DiStefano, et al., U.S. Pat. No. 6,104,087; and Bezuk, et al., U.S. Pat. No. 4,845,542, each disclose diverse methods and structures directed to the build up of compliant or flexible interconnections and are primarily concerned with complicated multi-step and consequently, expensive processing procedures in the manufacture of integrated circuits or the like structures.

SUMMARY OF THE INVENTION

More specifically, the present invention relates to an obtention in a cost reduction of the compliant interconnect build by, in a novel and inventive manner, devising a method of replacing the complicated processing required in the prior art with simple laser assisted chemical vapor deposition (LCVD) of the interconnect. Hereby, in contrast with the invention, Bezuk, et al., U.S. Pat. No. 4,845,542 teaches the employment of LCVD to deposit rigid post interconnects. The interconnect design of Bezuk, et al. does not concern itself with z-direction compliance, and only a minimal x-y direction compliance, and is adapted to be used between adjacent wafers, in the absence of any CTE difference, and contemplates the no use of any masks or lens-arrays, in effect, a single interconnect build at any one time. The interconnect shapes described in that patent are all subject to fatigue related issues due to a lack of spring characteristics in the build. Aluminum, as disclosed therein, also has the drawback of creep, thus opening a possibility of permanent deformation during joining and/or thermal stressing. Also noted is that the applied solder in Bezuk, et al. has a tendency to wick away, particularly onto the Ni post, reducing the solder volume in an uncontrolled manner causing problems in the process of chip joining.

The present invention concerns itself with eliminating or ameliorating the problems delineated above with regard to the prior art, and more specifically is concerned with a two-fold method using thermally activated chemical vapor deposition (TACVD) adapted to deposit the conductor forming the compliant or flexible interconnect structure facilitating z-direction as well as x- and y-direction compliance. The thermal activation of metal deposition is accomplished using for example, an Ar+ (Argon) laser (laser assisted chemical vapor deposition, (LCVD). The deposition temperatures are <1000K utilizing either pulsed and/or continuous wave laser heating of a substrate constituted of a laser energy absorbing material.

Pursuant to a first embodiment, the invention provides for x-, y-, and z-directional movement of the laser with well defined focal point to directly 'write' or produce a spring-structure type of interconnect which is flexible but non-collapsible in nature. Several interconnects can be 'written' or formed simultaneously by a unique usage of microlenses, focusing, and/or masking as taught in co-pending U.S. patent application Ser. No. 10/686,640, filed on Oct. 17, 2003, which is commonly assigned to the present assignee, and the entire disclosure of which is incorporated herein by reference.

In accordance with a further embodiment of the invention, there is entailed a reduction in the amount of lithography in order to first build a z-direction compressible polymeric base with via-hole opening to the wiring, as taught, for example, in Patel, U.S. Pat. No. 6,528,349 B1, the disclosure of which is incorporated herein by reference in its entirety. In this embodiment, a blanket conductor film is deposited onto the organic surface. The localized heating effected by the laser exposure is now performed through a mask opening, or is directly 'written' or produced using a focused laser beam through a matrix of microlenses and pre-determined x-, y-, and z-movements of the sample, or the laser/mask or a laser/microlens system as disclosed in above-mentioned U.S. patent application Ser. No. 10/686,640.

Concerning the foregoing features and embodiments, in particular, there are in evidence a number of aspects to which the invention is directed, and which are unique from the standpoint of providing a simple solution in the formation of a compliant and flexible interconnection for preferably integrated circuits, and which is resilient in x-, y- and z-directions and planes.

Accordingly, it is an object of the present invention to provide a flexible interconnect comprising of laser absorbing base, LCVD deposited interconnect of certain shape, and solder wettable pad at the tip of the flexible interconnect.

An object of the present invention resides in providing a barrier against solder migration down the flexible interconnect made of glassy inorganic or organic material, whereas a further aspect of the invention contemplates providing a barrier against solder migration made of silica or of another insulator using an LCVD process.

An object of the present invention is to provide a flexible interconnect on a substrate comprising of laser absorbing base, LCVD deposited interconnect of certain shape, and having mechanically and chemically durable and/or physically abrasive surface characteristics such that repetitive electrical and physical contact can be made to the device under test.

Another object of the present invention provides for a flexible interconnect matrix with varied x-y dimensions accounting for a difference in the distance from a neutral point.

A further object of the present invention pertains to the provision of a method of flexible interconnect orientation relative to the neutral point so as to allow an optimum orientation for maximum needed deflection of given interconnect which will account for a CTE mismatch between a substrate and the therewith connected Si-element.

Yet another object of the present invention provides a method to directly 'write' or generate the free-standing flexible interconnects using a unique combination of LCVD with lasermasks or microlens arrays. In this instance, the method is adapted to deposit the flexible interconnect onto a laser absorbing material on a compressible polymer base which has been previously patterned.

Still another object of the present invention provides for a method adapted to simultaneously cause a localized release of the flexible interconnect base of the compressible polymer base so as to allow free x-y movement of the flexible interconnect after the excess of the blanket interconnect base metallurgy has been removed using techniques known in the art.

None of the foregoing objects, aspects and features are known or in existence in the current state-of-the-art, whereby the present invention is unique in the provision of a concept of a build up of an integrated circuit structure or electronic package providing for x-, y- and z-directionally, compliant and/or flexible interconnections utilizing a thermal LCVD approach, as described hereinbelow in more specific detail.

BRIEF DESCRIPTION OF THE DRAWINGS

Reference may now be made to the following detailed description of preferred embodiments of the invention, taken in conjunction with the accompanying drawings; in which:

FIG. 3A represents a first step showing the interconnection of a base adhesion layer and LCVD metal deposition initiation layer;

FIG. 3B illustrates solder deposited on solder wettable metal metallurgy on the compliant C-shaped interconnection;

FIG. 3C illustrates a chip with a solder wettable bottom surface metallurgy positioned onto a substrate via the interposition of flexible interconnections;

FIG. 3D illustrates, on an enlarged scale, the encircled detail from FIG. 3A of the drawings;

FIG. 5B illustrates a laser deposited blanket metal film, which has been provided on a polymer surface;

FIGS. 5C through 5D illustrate various steps in removing and coating the material;

FIG. 5E illustrates a side view of the finished compliant interconnection, as shown also in a plan view of FIG. 5F;

DETAILED DESCRIPTION OF THE INVENTION

In specific detail, the invention concept is directed to interconnecting Si-components to CTE mismatched Si-component carriers and establishing a temporary contact between Si-components and a probe substrate for electrical and burn-in tests. The Si-component may be stacked silicon, Si-chips bonded to Si-carrier or combination of both which then are bonded to the next level packaging made of inorganic or organic material or material combination.

LCVD interconnect material may be readily selected from the list of typical materials which are available for LCVD and wherein Table 1 shows presently available materials.

TABLE 1

Typical LCVD metals and their properties

| Metal/precursor | Material properties | Resistivity μΩcm | Max writing rate μm/s |
|---|---|---|---|
| W/WF6/H2 | α-phase, low stress | 12-25 | 200 |
| Ni/Ni(CO)5 | micro- or polycrystalline | 15-70 | 200 |
| Co/Co2(CO)10 | microcrystalline | 13-25 | 50 |
| Pt/Pt(PF3)4 | microcrystalline | 11-15 | 200 |
| Al/TMAA | polycrystalline | 4 | 200 |
| Cu/Cu(TMVS)hFac) | microcrystalline | 7 | 10 |
| Mo | microcrystalline | 24 | 100 |
| Au/AuAcAc | polycrystalline | 3 | 10 |

The foregoing does not in any manner limit the materials of consideration such as are set forth in Table 1. Metal properties which are generally of interest are listed in Table 2 herein below.

TABLE 2

General metal properties

| Material | E (Gpa) | ΔE/ΔT MPa/C | σ$_y$ (MPa) | CTE (ppm/C) | Resistivity μΩcm | Thermal Conductivity (W/mK) | Poisson ratio |
|---|---|---|---|---|---|---|---|
| Cu | 110 | −39 | 320 | 16.5 | 1.73 | 380 | 0.35 |
| Au | 79 | −19 | 210 | 14.2 | 3 | 317 | 0.35 |
| Al | 72 | −31 | 110 | 23.1 | 4 | 237 | 0.345 |
| Ni | 207 | | 320 | 13.4 | 6.4 | 91 | 0.31 |
| Co | 211 | | 78 | 13.0 | 6.2 | 100 | 0.32 |
| W | 411 | −42 | 1800 | 4.5 | 5.39 | 180 | 0.28 |
| Mo | 300 | −43 | 840 | 4.8 | 5.7 | 140 | 0.321 |
| Pt | 168 | −23 | 160 | 8.8 | 10.6 | 72 | 0.38 |
| Ru | 422 | | 550 | 6.4 | 7.1 | 117 | 0.25 |

Selection of the interconnect material is effected by the required spring characteristics, in essence, flexibility and compliance which, in turn, are effected by the dimensions of the Si-component, ΔCTE between the Si-component and the substrate, and the encountered temperature range.

Any thermally activated CVD process can be activated using laser as the heat source. Thus insulators, such as $Si_3N_4$, and alloys (to tailor flexible interconnect properties) can be deposited by using LCVD.

For instance, the dimensions of the interconnect are determined by the Si-component x-y dimensions, Si-component and substrate ΔCTE, the location of interconnect relative to a neutral point, requires z-dimension compliance.

Figure 1A:
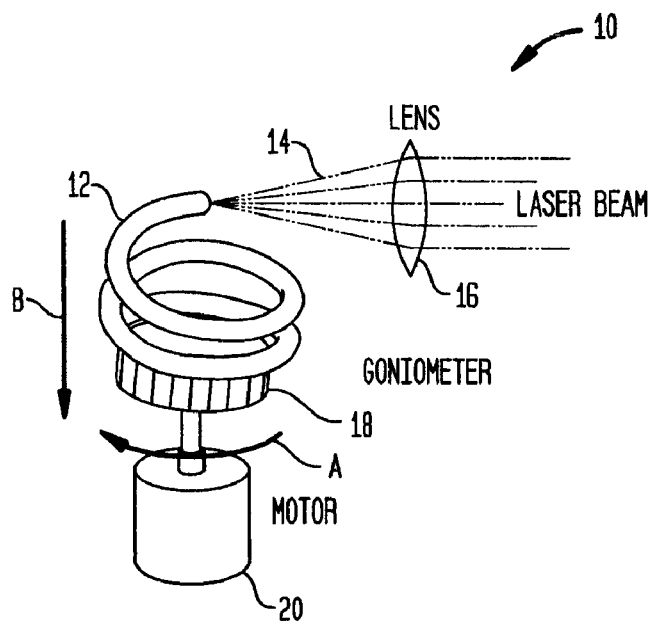
FIGS. 1A through 1D disclose aspects in the build up of a free-standing complex microstructure without the use of masking, with regard to two specific embodiments thereof pursuant to the invention.
Figure 1B:
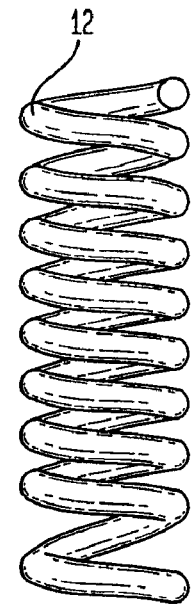

Referring in detail to the drawings, and particularly FIGS. 1A and 1B, there is provided an arrangement 10 for the forming or fabrication of a flexible or compliant interconnect 12, which is in essentially in the shape of a spiral, as shown in enlarged detail in FIG. 1B. In this instance, the flexible interconnect 12 is formed through the intermediary of a laser beam 14 and a microlens array 16 (only a single lens being illustrated) and which, if desired, may be optionally combined with substrate movement or rotation. In this instance, there is provided a goniometer 18, which is rotated in the direction of Arrow A through the intermediary of a suitable drive motor 20, and wherein a vertical displacement is implemented in the direction of Arrow B in order to form the flexible interconnect 12 in the spiral shape in the z-direction of an integrated circuit structure (not shown). Pursuant to this aspect, the foregoing method of fabrication of the flexible interconnect may be also implemented through a dielectric mask rather than a microlens array, with the employment of either the laser, as mentioned hereinabove, or through imparting a substrate micromovement, or by a combination of these particular features and/or movements.

Figure 1C:
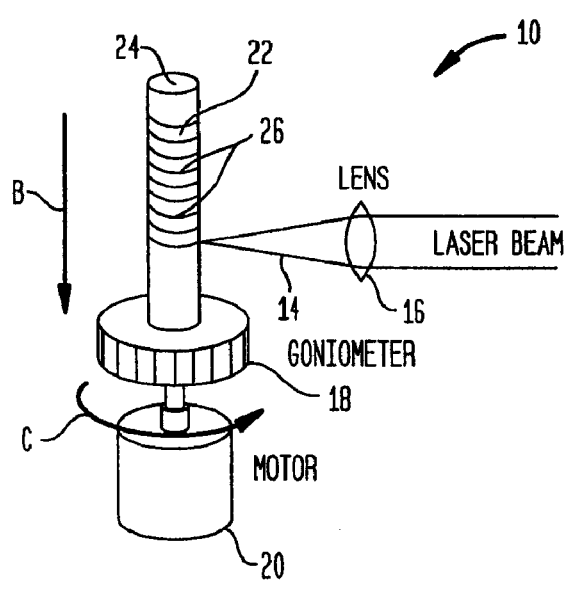
Figure 1D:
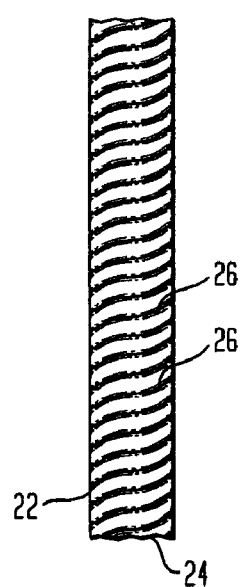

As illustrated in FIG. 1A, which produces the spiral shape of the flexible interconnect 12 of FIG. 1B, it is also possible to contemplate a modification, as shown in FIGS. 1C and 1D, wherein rather than the spiral of FIG. 1B, there is provided a spiral 22 in the form of deposition about a rod shaped structure 24 through the intermediary of a microlens and laser beam, which is similar to the previous embodiment. In this structure, the goniometer 18 is rotated in an opposite direction, as shown by arrow C, so as to produce a series of coil-like bands 26 about the vertically extending structure 24 in producing the spiral flexible interconnect 22.

Figure 2:
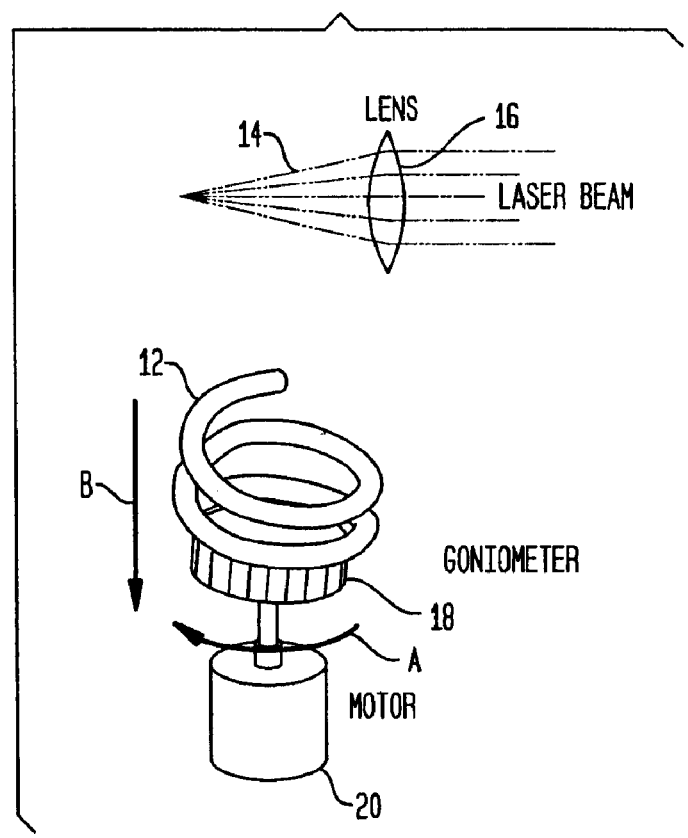
FIG. 2 illustrates a modification representative of an alternate physical orientation of a laser employed in implementing the inventive method, whereby a spiral connect microstructure is being fabricated utilizing the LCVD concept.

As shown in FIG. 2 of the drawings, in this instance there may be provided a somewhat different arrangement of the laser beam 14 and microlens array 16 relative to the goniometer, as shown in FIGS. 1A and 1C of the drawings. For the remainder, the fabrication method, with the exception of the orientation, is similar to that of FIG. 1A, in order to produce the spirally shaped flexible interconnect. Basically, the embodiments illustrated in FIGS. 1A through 1D are directed to the formation or fabrication of flexible or complaint interconnects built up of complex free-staining microstructures without the application of masking, and wherein the alternative physical orientation of the lasers and the spiral microstructures being fabricated employ the unique LCVD approach pursuant to the invention. This also applies to the alternative arrangement for the laser beam and microlens arrangement, as shown in FIG. 2 of the drawings.

As illustrated in the embodiment of FIGS. 3A through 3D, showing stages or steps in the formation of C-shaped interconnects 30, which are essentially of a flexible or compliant nature especially in the z-direction and wherein these are illustrated as being positioned on an interconnect base 32 on a substrate 33, which base is constituted of an adhesion layer 34 and an LCVD metal deposition layer 36. Basically, the tip 38 of each C-interconnect is comprised of an adhesion layer 39, and where solder wettable material or metal 42 and inorganic or organic solder barrier 41 is arranged thereon.

Figure 3A:
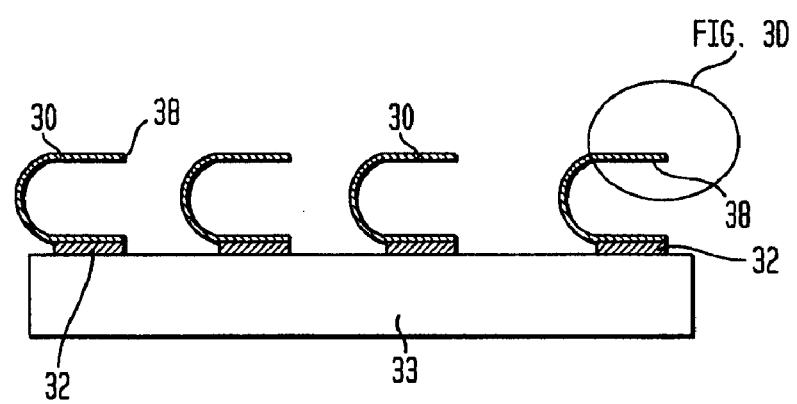
FIGS. 3A through 3D illustrate sequential steps in the forming of C-shaped compliant interconnections shown in the z-direction, whereby
Figure 3B:
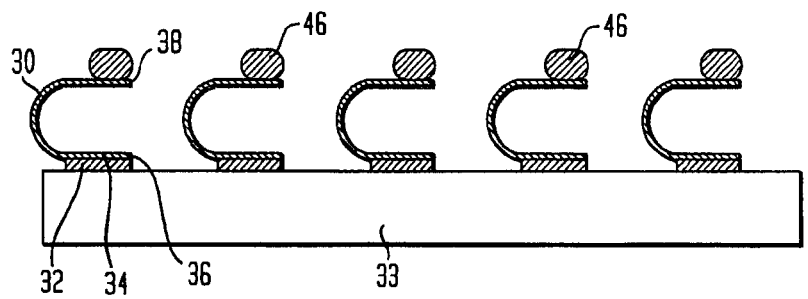
Figure 3C:
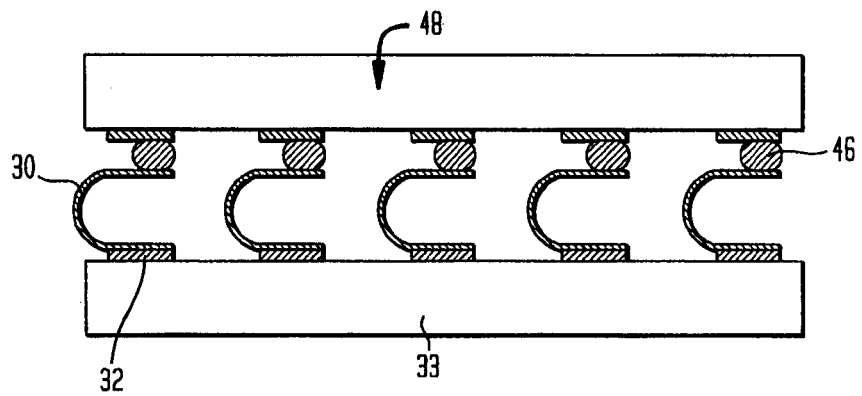
Figure 3D:
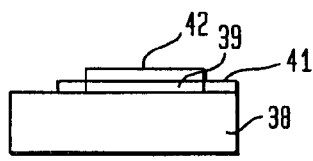

As illustrated in FIG. 3B, the interconnects 30 are shown with solder deposited on the solder wettable metallurgy 42, for instance, in the nature of solder balls 46 located proximate the free tip end 38 of the C-shaped interconnect 30. As illustrated in FIG. 3C of the drawings, in that instance, a chip 48 has been positioned on the solder wettable metallurgy 42 by means of solder wettable bottom surface metallurgy, known in the technology as being bonded to the substrate or base 32 through the flexible C-shaped interconnects 30. This is shown in further enlarged detail in FIG. 3D of the drawings, wherein it becomes readily apparent that the solder may also be deposited on the chip solder wettable metallurgy, as opposed to being deposited on the flexible C-shaped interconnect tip 38.

Figure 4:
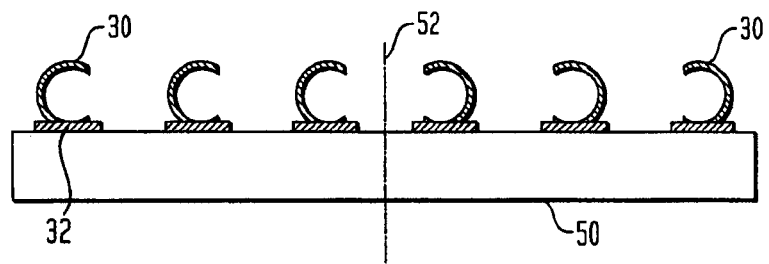
FIG. 4 illustrates, generally schematically, a preferred orientation of a plurality of flexible interconnects with respect to a neutral point on a chip or Si-carrier, with the interconnects being arranged radially spaced about the neutral point.

Reverting to FIG. 4 of the drawings, this illustrates a preferred orientation of a plurality of C-interconnects 30 arranged mutually spaced on a chip or silicon carrier 50 relative to a neutral point or axis 52 to compensate for CTE mismatch-caused stresses. In that manner, the C-shaped flexible interconnects 30 may be readily oriented radially about the neutral point or at particular spacings relative to the neutral point. Available in the arrangement of the C-interconnects 30 relative to distances from the neutral point 52 is the possibility of shaping the structures thereof so as to be tailored in order to match encountered CTE mismatches to thereby compensate for the fact that the C-interconnect 30 nearer the central or neutral point can be thinner or skinnier in its construction requiring a lesser x-y compliance, in comparison to the further outermost spaced C-interconnects, which are subjected to higher stresses. This, in essence, provides for a satisfactory balancing of CTE mismatches, which are frequently encountered in the technology and whereby the particular diverse spacing of the various radially offset C-interconnects 30 relative to the neutral point or axis is adapted to compensate for such variations in the CTE mismatches, as the distance of the interconnect increases from the neutral point or axis.

Figure 5A:
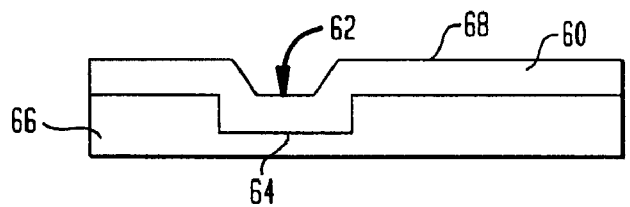
FIG. 5A through 5F illustrate sequential steps in implementing the formation of another embodiment of compliant interconnects pursuant to the invention, wherein in FIG. 5A the via hole has been opened to access a metal pad on an organic chip carrier pursuant to prior art methods.
Figure 5B:
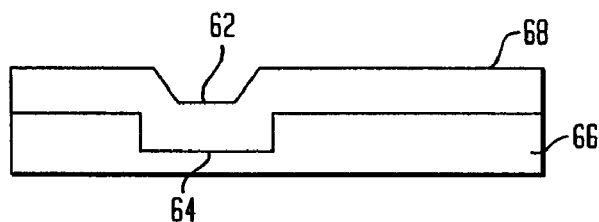
Figure 5C:
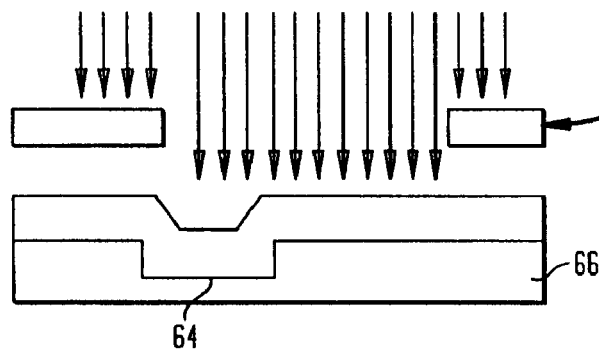
Figure 5D:
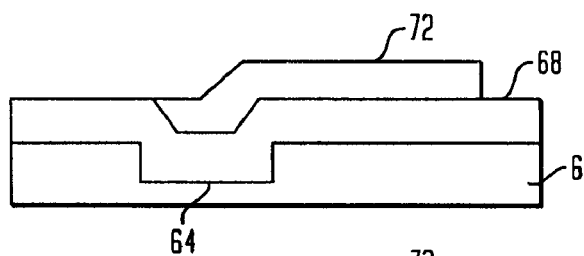
Figure 5E:
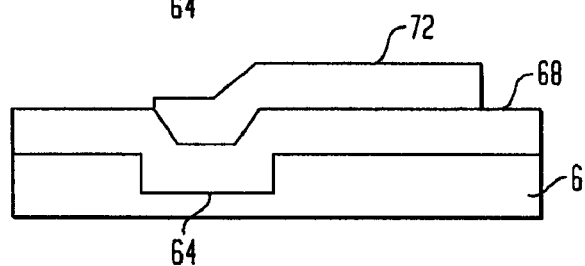
Figure 5F:
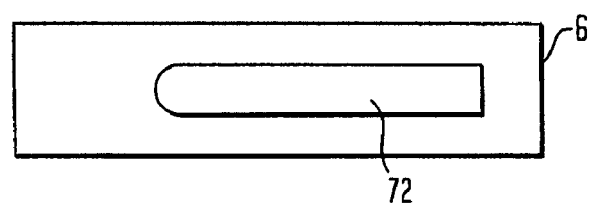

Reverting to the configuration, as shown in FIGS. 5A through 5F of the drawings, there is disclosed a further embodiment of the invention in which a polymer film 60 is utilized to supply a z-direction control in compliance so as to compensate for CTE mismatches. A via hole 62 is opened so as to provide access to a metal pad 64 on an organic chip carrier 66, which may employ fabrication methods known in the art. A thin laser-absorbing blanket metal film 68 of a focused laser-beam applied nature (LCVD) is deposited on the polymer film surface 60. Thereafter, a dielectric mask 70 may be utilized with the focused laser beam in order to deposit a compliant interconnect 72 onto the blanket metal coating film 68, as shown in FIGS. 5C and 5D. The blanket metal coating film 68 is then removed through the employment of either wet or dry processing methods, both of which are well known in the art, as represented in the further process step of FIG. 5E. This structure is also illustrated in a plan view, as shown in FIG. 5F. In essence, in this manner, there is provided an alternative method to the fabrication structures, as represented in FIGS. 1A and 1D of the drawings.

Figure 6:
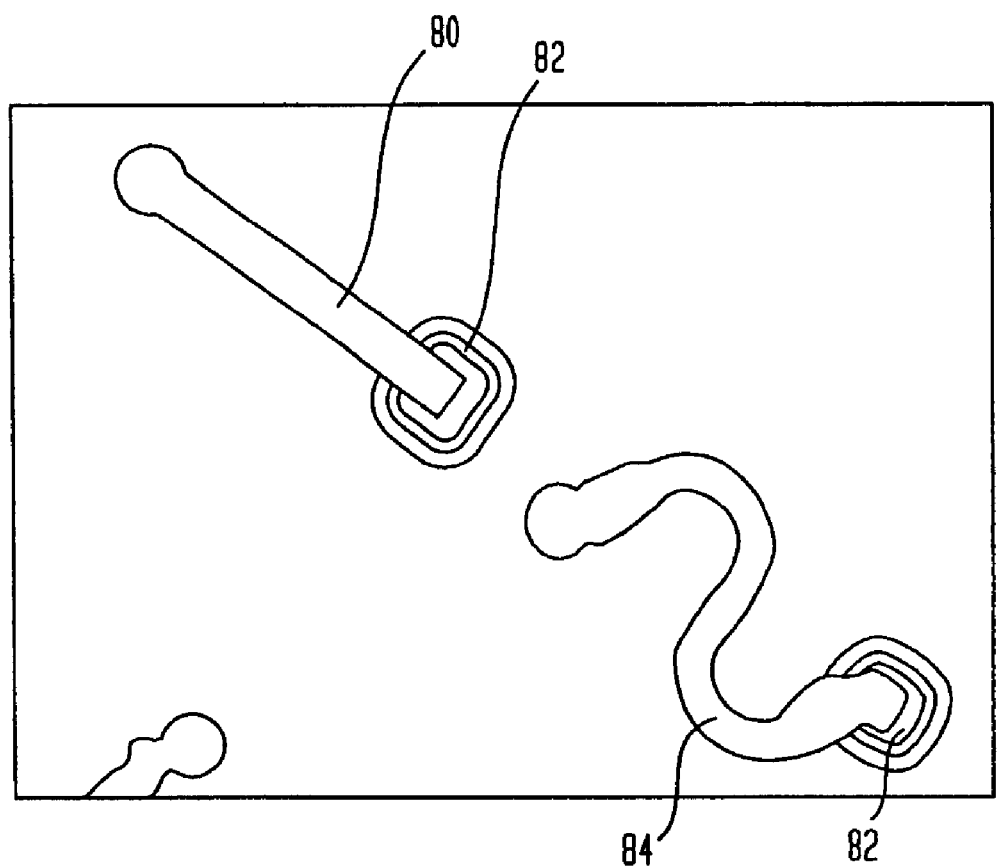
FIG. 6 illustrates two different shapes of compliant interconnects formed pursuant to the present invention.
Figure 7:
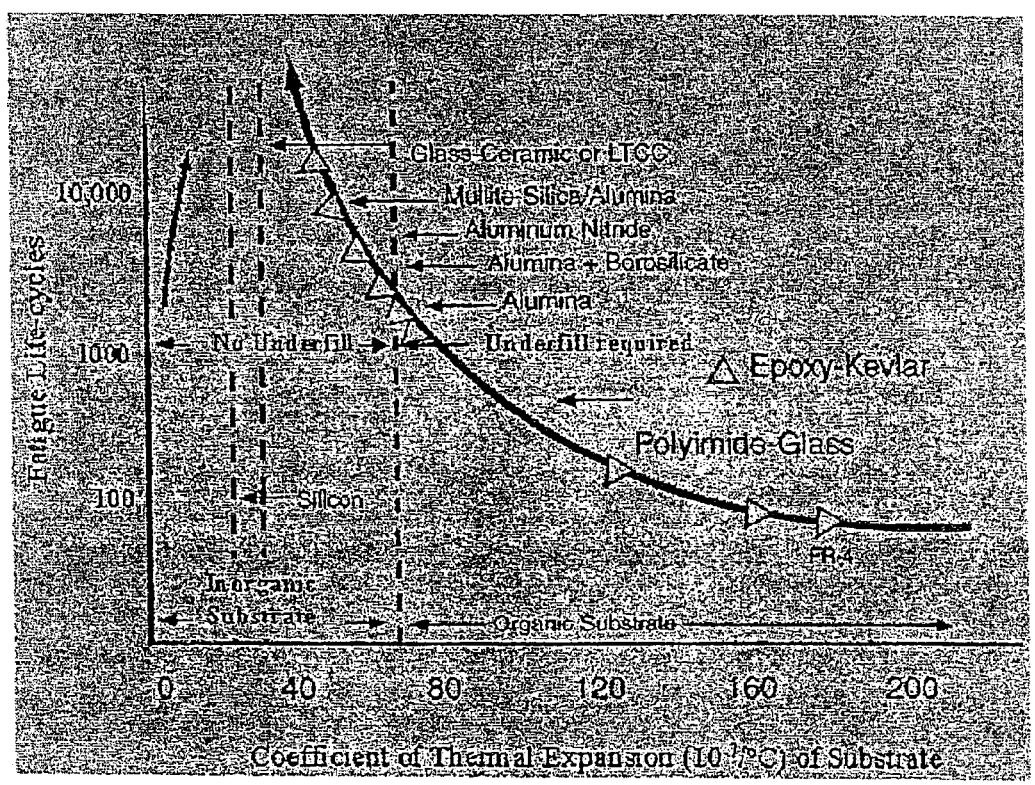
FIG. 7 represents a graph plotting fatigue life-cycles versus coefficients of thermal expansion of the substrate for the embodiments.

Reverting to FIG. 6 of the drawings, there are illustrated two different shapes for compliant interconnects, in which one is essentially of a rod shaped element 80 extending from a via 82, whereas a further one provides a snake-like or winding compliant or flexible interconnect 84. Readily, it is apparent that numerous other configurations of flexible and compliant interconnects can be employed by the present invention, and the drawings only represent typical embodiments thereof, not limited thereto.

In summation, since LCVD is based on thermally activated chemical vapor deposition, and since the laser selected couples with the metals selected thus only heating that area it is focused on, then it is possible to effect LCVD of different shapes with clever mechanical movement of the substrate without the need to keep the laser parallel to the direction of surface of growth, but can be positioned perpendicular to the direction of growth when necessary. A large area simultaneous deposition of C-shaped interconnects is possible by either moving a mask, laser/microlens system, or in a computer controlled path consistent with the desired interconnect shape.

Moreover, the present invention provides a method to selectively delaminate the metal bound to the polymer surface during the initial steps of laser deposition, where the duration of the laser at the PVD metal on the polymer surface is extended long enough so that slight thermal decomposition is effected at the interfacial region of the metal-polymer stack. The polymer is selected from thermal stable materials such as polyimides, polyphenylenes, and so forth. Pursuant to a method, it is possible to build a solder wettable metallurgy at the tip of the flexible interconnect where the solder is contained at the tip. A LCVD insulator, such as Si3N4, is deposited on the tip of the flexible interconnect. This is then followed by adhesion layer deposition, such a Ni, and then Au deposition using LCVD process. Another aspect of the present invention is to use selective plating of Ni at the tip of the flexible interconnects followed by immersion in Au.

Moreover, the present invention provides a method to build a probe substrate with flexible temporary connections for electrical and burn-in tests. Pursuant to this method, it is possible to build a flexible connection with surface roughness by tailoring the deposition conditions thus allowing effective abrasion of contact pad on test device to result in good electrical contact. Moreover, pursuant to this method is coating of the rough, preferably tungsten (or another conductor with high yield stress), surface with a noble hard metal such as, but not limited to, ruthenium using LCVD or plating resulting in rough, hard, inert, and electrically conductive flexible probe.

While it is apparent that the invention herein disclosed is well calculated to fulfill the objects stated above, it will be appreciated that numerous modifications and embodiments may be devised by those skilled in the art, and it is intended that the appended claims cover all such modifications and embodiments as fall within the true spirit and scope of the present invention.

What is claimed is:

1. A method of forming flexible electrical interconnects for a semiconductor package assembly, comprising providing a substrate and at least one integrated circuit chip mounted on said substrate, and interposing at least one said flexible interconnect between said substrate and said at least one chip to form a compliant electrical connection between said substrate and said at least one integrated circuit chip, said compliant flexible interconnect is constituted of a material deposited by laser-assisted chemical vapor deposition (LCVD), wherein said compliant flexible interconnect comprises a spirally shaped member produced by an optical system in operative conjunction with said LCVD process, said compliant flexible interconnect comprises a generally upright C-shaped member extending between facing surfaces of said substrate and said at least one integrated circuit chip, wherein a plurality of said C-shaped members are spaced in x-y planar dimensions at varied spacings from a neutral point so as to compensate for differences in coefficients of expansion between said substrate and said at least one integrated circuit chip encountered responsive to heat generated during operation of said semiconductor package assembly, and wherein a tip of each said C-shaped member, which supports said at least one integrated circuit chip is provided with a solder wettable metallurgical material, said solder wettable metallurgical material being essentially constituted of an Ni adhesion layer and solder wettable gold (Au).

* * * * *